United States Patent

Simmons et al.

[11] Patent Number: 5,862,010
[45] Date of Patent: Jan. 19, 1999

[54] TRANSDUCER SUSPENSION SYSTEM

[75] Inventors: Randall George Simmons; Victor Wing Chun Shum, both of San Jose, Calif.

[73] Assignee: International Business Machines Corporation, Armonk, N.Y.

[21] Appl. No.: 889,836

[22] Filed: Jul. 8, 1997

[51] Int. Cl.⁶ .............................. G11B 5/60; G11B 21/21
[52] U.S. Cl. .................... 360/97.01; 360/104; 360/106
[58] Field of Search .................... 360/103, 104, 360/105, 106, 109, 97.01, 97.02, 97.03, 107, 108

[56] References Cited

U.S. PATENT DOCUMENTS

| | | | |
|---|---|---|---|
| 3,051,954 | 8/1962 | Osterlund | 346/74 |
| 3,269,861 | 8/1966 | Schneble et al. | 117/212 |
| 3,633,189 | 1/1972 | Billawala | 360/128 |
| 3,960,622 | 6/1976 | Hofling et al. | 156/3 |
| 4,645,280 | 2/1987 | Gordon et al. | 360/104 |
| 4,819,094 | 4/1989 | Oberg | 360/104 |
| 4,975,795 | 12/1990 | Spash | 360/104 |
| 4,996,623 | 2/1991 | Erpelding et al. | 360/104 |
| 5,121,273 | 6/1992 | Slezak | 360/104 |
| 5,140,482 | 8/1992 | Kimura et al. | 360/104 |
| 5,491,597 | 2/1996 | Bennin et al. | 360/104 |
| 5,519,552 | 5/1996 | Kohira et al. | 360/104 |
| 5,560,097 | 10/1996 | Bajhorek et al. | 29/603.12 |
| 5,608,591 | 3/1997 | Klaassen | 360/104 |
| 5,694,270 | 12/1997 | Sone et al. | 360/104 |

FOREIGN PATENT DOCUMENTS

| | | |
|---|---|---|
| 57-20961 | 5/1982 | Japan . |
| 5-36048 | 6/1993 | Japan . |
| 53-30310 | 6/1993 | Japan . |
| 6-124558 | 6/1994 | Japan . |
| 6-295546 | 10/1994 | Japan . |
| 8-45213 | 2/1996 | Japan . |

*Primary Examiner*—David L. Ometz
*Attorney, Agent, or Firm*—Douglas R. Millett

[57] ABSTRACT

A transducer suspension system has a transducer head, laminated member and a load beam. The laminated member is comprised of a support layer, at least two electrically insulating layers, and at least two electrically conducting layers. The electrical leads are formed directly into the laminated member such that each electrical lead is directly above or below at least one other electrical lead. The overlying leads have noise cancellation similar to that for twisted wire pairs. In addition, by stacking the electrical leads, more electrical leads can be accommodated in the same suspension width.

2 Claims, 8 Drawing Sheets

TRANSDUCER SUSPENSION SYSTEM

BACKGROUND OF THE INVENTION

1. Field of the Invention

This invention relates generally to transducer suspension systems and more particularly to a suspension system with stacked electrical leads.

2. Description of Prior Art

Direct access storage devices (DASD), or disk drives, store information on concentric tracks of a rotatable magnetic recording disk. A magnetic head or transducer element is moved from track to track to record and read the desired information. Typically, the magnetic head is positioned on a air bearing slider which flies above the surface of the disk as the disk rotates. In some recently proposed disk drives, the slider (or carrier) rides on a liquid film or bearing on the disk. A suspension assembly connects the slider to a rotary or linear actuator. The suspension provides support for the slider.

Examples of suspension systems are shown in the following references: U.S. Pat. No. 5,560,097, issued Oct. 1, 1996, by Bajhorek et al; U.S. Pat. No. 5,519,552, issued May 21, 1996, by Kohira et al; U.S. Pat. No. 5,491,597, issued Feb. 13, 1996, by Bennin et al; U.S. Pat. No. 4,996,623, issued Feb. 26, 1991, by Erpelding et al; U.S. Pat. No. 4,975,795, issued Dec. 4, 1990, by Spash; U.S. Pat. No. 4,819,094, issued Apr. 4, 1989 by Oberg; U.S. Pat. No. 4,645,280, issued Feb. 24, 1987, by Gordon et al; U.S. Pat. No. 3,960,622, issued Jun. 1, 1976 by Hofling et al; U.S. Pat. No. 3,633,189, issued Jan. 4, 1972 by Billawala; U.S. Pat. No. 3,269,861, issued Aug. 30, 1966, to Schneble et al; U.S. Pat. No. 3,051,954, issued Aug. 28, 1962, by Osterlund; TW 276333, published May 21, 1996, by Klaasen; Japanese Patent Application 06-194945, published Feb. 16, 1996, by Matsumoto et al; Japanese Patent Application 05-81630, published Oct. 21, 1994, by Yamamura et al; Japanese Patent Application 03-211668, published Jun. 22, 1993, by Inaba; Japanese Patent Application 55-93422, published May 22, 1982, by Watanabe; Japanese Patent Application 51-104787, published Mar. 22, 1978, by Takahashi; and Japanese Patent Application 4-272635, published May 6, 1994.

The suspension must meet several requirements. The suspension must be flexible and provide a bias force in the vertical direction. This is necessary to provide a compensating force to the lifting force of the air bearing in order to keep the slider at the correct height above the disk. Also, vertical flexibility is needed to allow the slider to be loaded and unloaded away from the disk. Another requirement of the suspension is that it must provide a pivotal connection for the slider. Irregularities in operation may result in misalignment of the slider. The slider is able to compensate for these problems by pitching and/or rolling slightly to maintain the proper orientation necessary for the air bearing. Another requirement of the suspension is that it must be rigid in the lateral direction. This is needed to prevent the head from moving from side to side, which would result in the head reading the wrong track.

Disk drives have become smaller in size and their recording track density has increased dramatically. This has necessitated the use of smaller and smaller heads and suspensions. The smaller size makes it more difficult to string individual wires along the suspension to the head. Recently, it has been proposed that electrical leads be etched directly into the suspension in order to do away with the need to string separate wires.

However, these etched leads may have some disadvantages. The separately strung wires of the past were strung in twisted wire pairs. These twisted pairs were effective in canceling out the effects of external noise. The new etched leads run parallel to one another along the surface of the suspension and do not achieve the same degree of noise cancellation.

Another disadvantage of the etched leads is that they require a certain distance of spacing between them. In the smaller suspensions of the future, the suspension width may limit the number of electrical leads. The newer transducer heads may require more electrical leads than in the past. What is needed is a suspension system which solves these problems.

SUMMARY OF THE INVENTION

Briefly, in a preferred embodiment of the present invention, a suspension system comprises a rigid load beam member and a laminated member. The laminated member is comprised of at least five layers: a support layer, at least two electrically insulating layers, and at least two electrically conducting layers. The laminated member is etched such that the electrical leads are formed on the conductive layers. The electrical leads are formed such that each lead is stacked with another lead from the electrically conducting layer directly above or below and all of the leads are run substantially in parallel along the longitudinal direction of the suspension, except for some turns and the front and back ends where the electrical connections are made. The result is that the leads are close enough to each other that noise cancellation is achieved and the width of the suspension may be reduced. In addition, more electrical leads may be accommodated.

For a fuller understanding of the nature and advantages of the present invention, reference should be made to the following detailed description taken in conjunction with the accompanying drawings.

DESCRIPTION OF THE PREFERRED EMBODIMENTS

Figure 1:
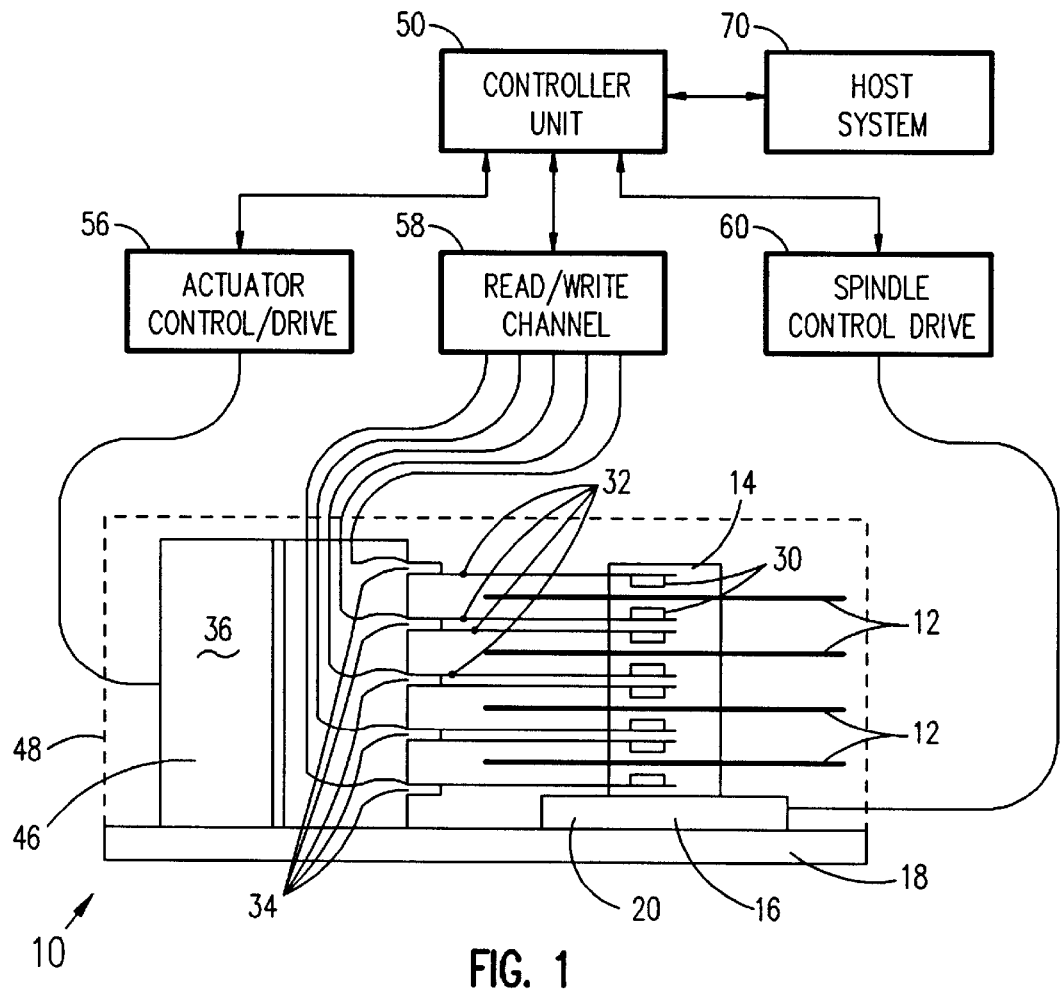
FIG. 1 is a schematic diagram of a data storage system of the present invention.
Figure 2:
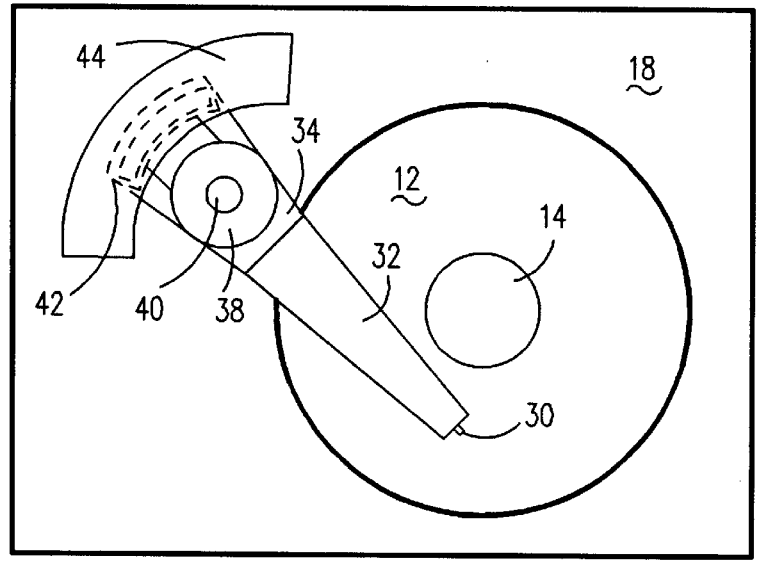
FIG. 2 is a top view of the system of FIG. 1.

FIGS. 1 and 2 show schematic diagrams of the data storage system of the present invention which is designated by the general reference number 10. System 10 comprises a plurality of magnetic recording disks 12. Each disk has a plurality of concentric data tracks. Disks 12 are mounted on a spindle motor shaft 14, which is connected to a spindle motor 16. Motor 16 is mounted to a chassis 18. The disks 12, spindle 14, and motor 16 comprise a disk stack assembly 20.

A plurality of read/write heads 30 are positioned over the disks 12 such that each surface of the disks 12 has a corresponding head (or slider) 30. Each head 30 is attached to one of a plurality of suspensions 32 which in turn are attached to a plurality of actuator arms 34. Arms 34 are connected to a rotary actuator 36. Alternatively, the arms 34 may be an integral part of a rotary actuator comb. Actuator 36 moves the heads in a radial direction across disks 12. Actuator 36 typically comprises a rotating member 38 mounted to a rotating bearing 40, a motor winding 42 and motor magnets 44. Actuator 36 is also mounted to chassis 18. Although a rotary actuator is shown in the preferred embodiment, a linear actuator could also be used. The heads 30, suspension 32, arms 34 and actuator 36 comprise an actuator assembly 46. The disk stack assembly 20 and the actuator assembly 46 are sealed in an enclosure 48 (shown by a dashed line) which provides protection from particulate contamination.

A controller unit 50 provides overall control to system 10. Controller unit 50 typically contains a central processing unit (CPU), memory unit and other digital circuitry. Controller 50 is connected to an actuator control/drive unit 56 which in turn is connected to actuator 36. This allows controller 50 to control the movement of heads 30 over disks 12. The controller 50 is connected to a read/write channel 58 which in turn is connected to the heads 30. This allows controller 50 to send and receive data from the disks 12. Controller 50 is connected to a spindle control/drive unit 60 which in turn is connected to the spindle motor 16. This allows controller 50 to control the rotation of disks 12. A host system 70, which is typically a computer system, is connected to the controller unit 50. System 60 may send digital data to controller 50 to be stored on disks 12, or may request the digital data be read from disks 12 and sent to the system 70. The basic operation of DASD units is well known in the art and is described in more detail in "Magnetic Recording Handbook", C. Dennis Mee and Eric D. Daniel, McGraw Hill Book Company, 1990.

Figure 3:
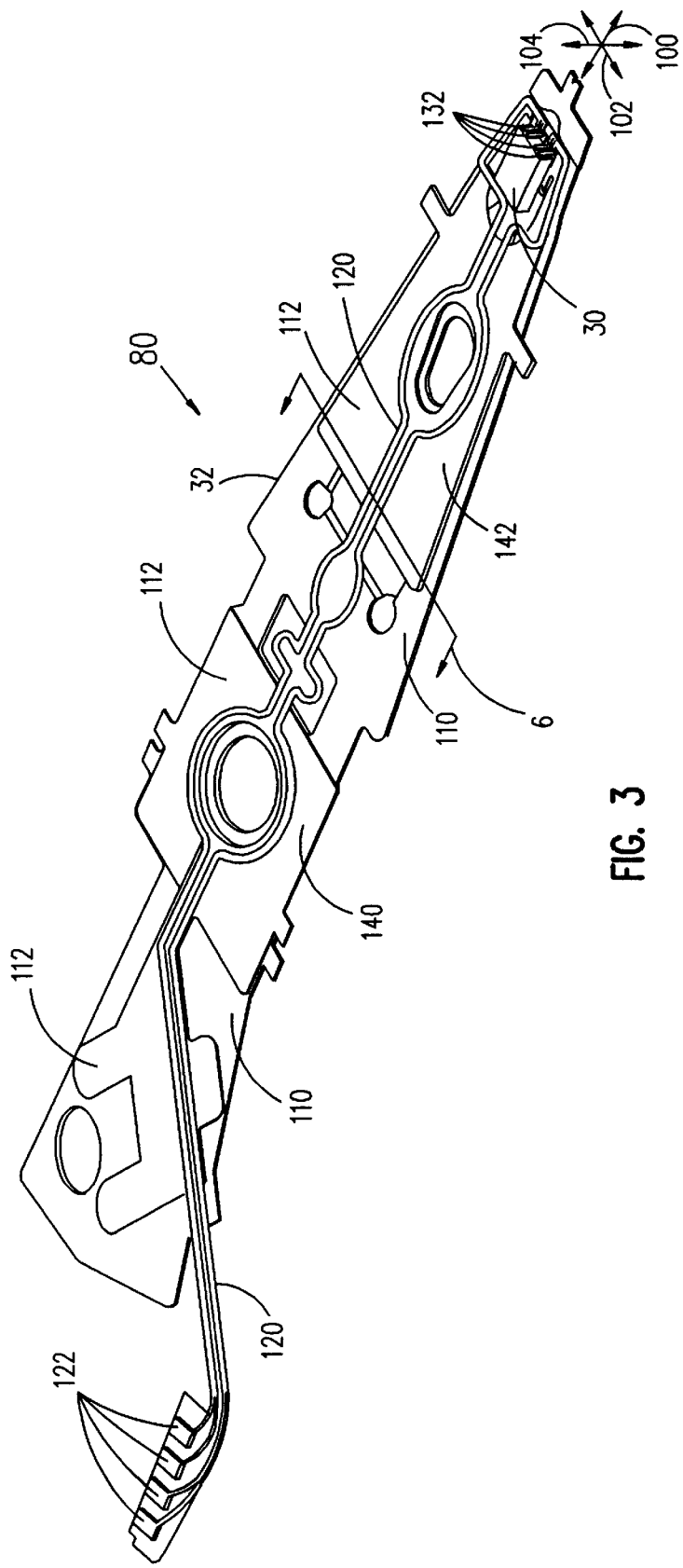
FIG. 3 is a detailed perspective view of a suspension system of FIG. 1.

FIG. 3 shows a perspective view of a head 30 attached to a suspension 32. This combination is referred to as a suspension assembly or head gimbal assembly (HGA) 80. Suspension 32 has a longitudinal axis 100, a lateral axis 102 and a perpendicular axis 104. Suspension 32 is comprised of a load beam 110 and a laminated member 112. Laminated member 112 is formed from a multi-layer laminated material comprised of a steel support layer, and two electrically insulating layers interspersed with two electrically conductive layers. The various layers of the laminated member 112 are etched away in a photolithographic process to form the desired shapes.

The suspension assembly 80 is extremely small. The distance from the end of the actuator arm 34 to the end of the suspension is typically on the order of 15.25 mm. The head 30 typically measures 1.25 mm×1.0 mm×0.3 mm.

The electrically conducting layers and electrically insulating layers are etched to form electrical lines (or leads) 120 which run from a rear termination pad area 122 to the head 30. Head 30 is comprised of a slider and transducer electronics. The electrical lines 120 terminate and are electrically attached to the head 30 at the head termination pads 132. The electrical lines 120 are bent vertically upward at the head termination pads 132.

The support layer of the laminated member 112 is formed into a rear member 140 and a flexure member 142 which are welded onto load beam 110. The rear member 140 is attached to actuator arm 34 by an adhesive, welding or swaging process. Flexure member 142 provides a gimbal mount for attachment of the head 30. The gimbal mount allows the head 30 to pivot in order to adjust its orientation (static attitude) to achieve the proper air bearing between the head 30 and disk 12 while the disk 12 is rotating. The rear member 140, flexure 142, and load beam 110 also serve the purpose of providing support for the electrical lines 120, among other purposes such as providing stiffness balance and an area for bonding or welding.

FIGS. 4a–4f show top views of the various element layers of suspension 32. FIGS. 4a–4e show respectively, an electrically conducting layer 150, an electrically insulating layer 152, an electrically conducting layer 154, an electrically insulating layer 156, and a support layer 158 of the laminated member 112. Initially, the layers 150–158 are layers in a single laminated sheet of material. The member 112 is then formed from the sheet by using photolithographic etch processes as are known in the art. Layers 150 and 154 are made of a conducting material such as copper. In a preferred embodiment, the material is 67025 copper and each layer has a thickness of between 0.01 mm and 10.018 mm and preferably 0.018 mm. Layers 152 and 156 are made of an electrically insulating material and in a preferred embodiment are made of polyimide or Teflon and each layer has a thickness of between 0.005 mm and 0.018 mm and preferably 0.018 mm. Layer 158 is made of a thin stiff material which is able to bend slightly, and in a preferred embodiment is made of stainless steel and has a thickness of between 0.018 mm and 0.051 mm and preferably 0.02 mm.

Figure 4A:
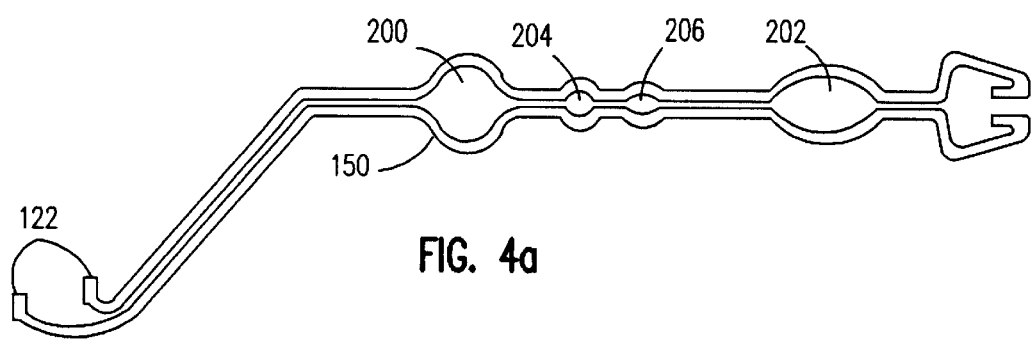
FIGS. 4a–f show top views of the layers of the suspension of FIG. 1.

Referring now to FIG. 4a, two of the electrical lines 120 are formed in layer 150. The lines 120 start at the termination pad area 122. Pads 122 provide connection to the read/write channel 58. The pads 122 are located on the side of the actuator arms 34 when the drive is fully assembled. The lines 120 run from the side of the arm 34 toward the center longitudinal axis 100 of the suspension 32. Lines 120 then run in a generally longitudinal direction toward the head 30.

The lines separate to run along both sides of apertures 200, 202, and 206. The apertures 200, 202 and 206 are used to provide access for tooling pins which are used to align the laminated member and the load beam during manufacture. Another separation of the lines 120 occurs at point 204 and is used to lessen the stress in the lines 120 due to movement of the suspension during operation.

At the distal end of suspension 32, the lines 120 separate and run along either side of the head 30, then turn backward to the head 30 to terminate at the rear face of head 30 at the head termination pads 132. This is necessary because the transducer electronics are located on the rear face of the slider. This rear face of the slider is the trailing face as the disk rotates beneath the suspension during operation. The lines 120 are bent 90° vertically in order to interface with the pads 132.

Figure 4B:
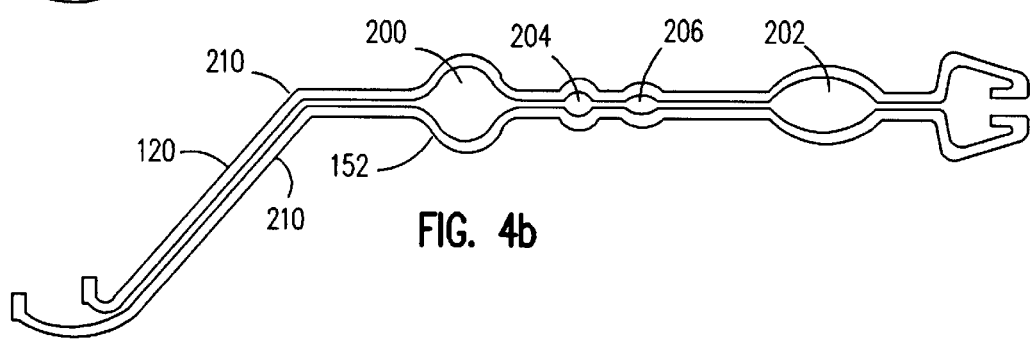

FIG. 4b shows a top view of the electrically insulating layer 152. Layer 152 is shaped to provide electrical insulation protection to the lines 120 of layer 150 which directly overlay the layer 152. Layer 152 forms an insulating strip 210 directly beneath the lines 120 of layer 150.

Figure 4C:
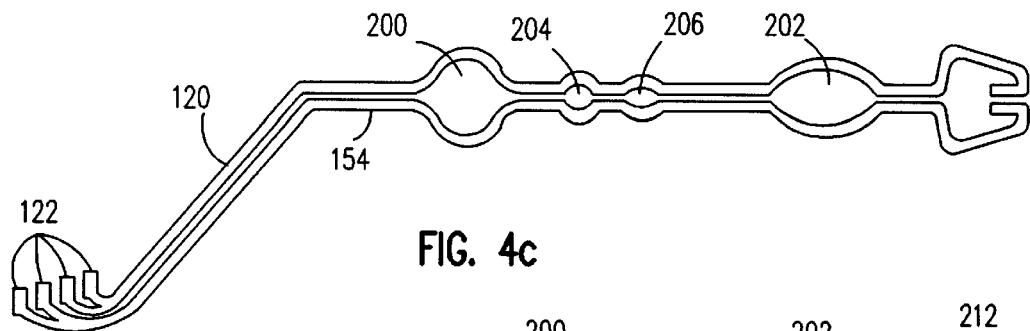

FIG. 4c shows a top view of the electrically conducting layer 154. Layer 154 is shaped to form lines 120 to correspond in shape to the lines 120 of layer 150. The lines of layer 154 directly underlie the lines of layer 150 except at the termination pad areas 122 and 132.

Figure 4D:
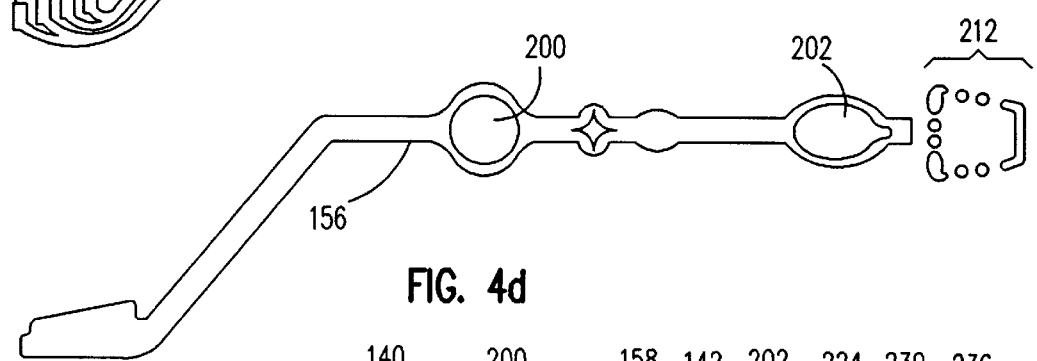

FIG. 4d shows a top view of the electrically insulating layer 156. Layer 156 is shaped to provide electrical insulation protection to the lines 120 of layer 154 which directly overlay the layer 156. Layer 156 forms an insulating strip directly beneath the lines 120 of layer 154. At the head area, layer 156 is shaped into a series of pads 212 which underlie lines 120. This is done to allow the lines 120 to be more flexible at the head area in order to minimize the change of static altitude of the head caused by the exertion of force by the lines 120 under different temperature and humidity conditions.

Figure 4E:
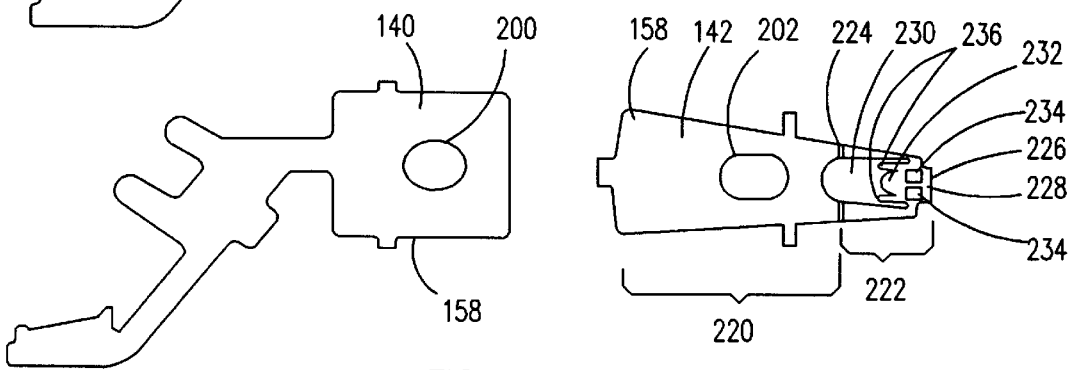

FIG. 4e shows a top view of the support layer 158. Rear member 140 provides support for the rear section of the lines 120. Flexure member 142 has a rear portion 220 and a front portion 222. Front portion 222 is raised slightly above the plane of rear portion 220 by means of a stamped bend 224. The front portion 222 has a distal end 226 having a front platform 228 which provides support for lines 120. Behind platform 228 is a flexure aperture 230. A tongue section 232 provides support and an attachment point for head 30. Between tongue section 232 and platform 228 are a pair of rectangular apertures 234. Apertures 234 allow the lines 120 to bend as they approach the termination pads 132. A pair of tabs 236 extend from tongue section 232 and function as motion limiters when they are bent back under load beam 110.

Figure 4F:
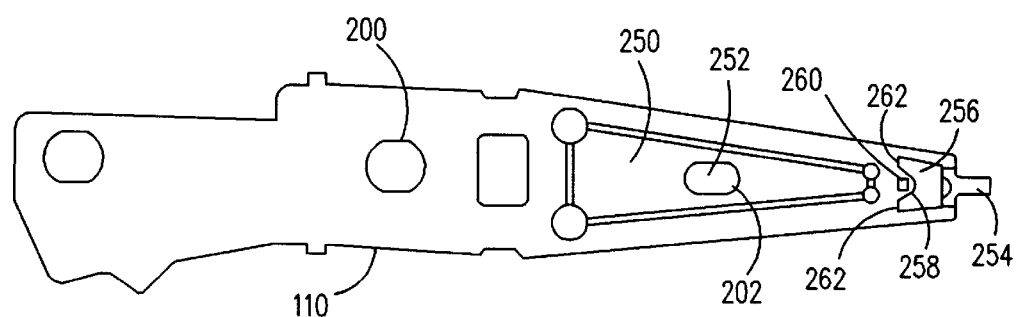

FIG. 4f shows a top view of load beam 110. Load beam 110 is generally flat and rigid and made of a stainless steel or other rigid material. In the preferred embodiment, the load beam 110 is stainless steel of about 0.025 to 0.076 mm. thick and preferably 0.038 mm. It is desirable to maintain the weight and inertia of the load beam 110 as small as possible without compromising its structural rigidity.

Load beam 110 has a depressed section 250 which is used to provide additional structural stiffness. Section 250 has an aperture 252 which is used for tool alignment during the manufacturing process.

Beam 110 has a distal end with a tab 254 which is used for merge and dynamic loading and unloading of the suspension. An aperture 256 is located behind tab 254. A tongue section 258 extends into aperture 256. A stamped raised button or dimple 260 is located on tongue 258. Dimple 260 contacts tongue section 232 of flexure member 142 and allows head 30 to gimbal (pitch and roll) slightly such that it is able to maintain the proper air bearing orientation. A pair of corners 262 of aperture 256 provide a contact point for tabs 236 of flexure 142 such that tabs 236 pass under load beam 110 and provide a motion limiting function for the flexure member 142. Beam 110 is also formed by a photolithographic process and the raised features are stamped. The laminated member 112 and the load beam 110 are attached by welding. The head 30 is attached to flexure tongue 232 by adhesive.

Figure 5:
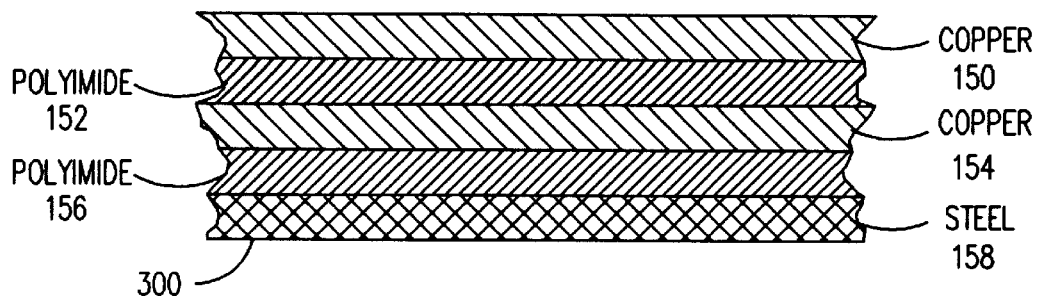
FIG. 5 is a cross sectional view of a laminated material.

FIG. 5 shows a cross sectional view of a laminated sheet 300. Sheet 300 is the laminated material which is used to form the laminated member 112. Sheet 300 contains layers 150, 152, 154, 156, 158 and the sheet 300 is then used to form the member 112 by photolithographic etched processes.

Figure 6:
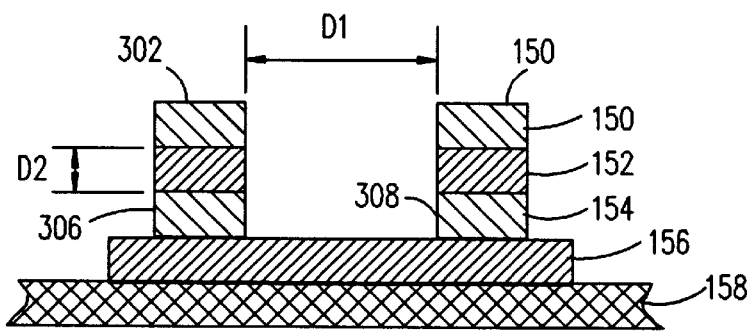
FIG. 6 is a cross sectional view of a laminated member of a suspension of FIG. 1.

FIG. 6 shows a cross sectional view of laminated member 112 taken along line 6 of FIG. 3. Starting with laminated sheet 300, a photoresist is applied to the top surface of layer 150. The photoresist is then patterned with a photolithographic mask such that only the areas for lines 120 (the areas where material is to remain) are exposed. The unexposed photoresist is then removed from the areas surrounding lines 120. The material is etched away such that the copper around lines 120 is removed. The developed and hardened photoresist protecting lines 120 is then removed. A similar series of steps is repeated for each layer such that each layer achieves the required geometry.

The resulting cross section shows that the lines 120 in the layers are now in a stacked relationship. Each line 302 and 304 of layer 150 has a corresponding underlying line 306 and 308 of layer 154. The two pairs of stacked lines 120 are separated by a thin insulating layer 152.

The etched process has limits as to how fine the features may be etched. For example, in today's etch processes the minimum distance D1 separating lines 120 is 35 microns. This is not sufficient to achieve noise cancellation. However, by stacking the electrical lines as in the present invention, the lines are separated by only the thickness D2 of the insulating material layer 152. This distance D2 is limited only by the ability to laminate thin materials and by the minimum electrical insulation needed. In the present invention layer 152 may be 5–18 microns thick. Smaller thicknesses may be possible with different materials and line voltages. This smaller separation between the lines allows for noise cancellation.

In addition, more lines may be packed into a smaller suspension width. In the preferred embodiment, one pair of lines 302, 306 may be used to connect to the write conductive element of the transducer head and the other pair of lines 304, 308 may be used to connect to the magnetoresistive read element of the transducer head. In the future, more complex transducers or microactuator elements located at the head may require additional electrical lines. The stacked lines of the present invention solves this problem.

Figure 7:
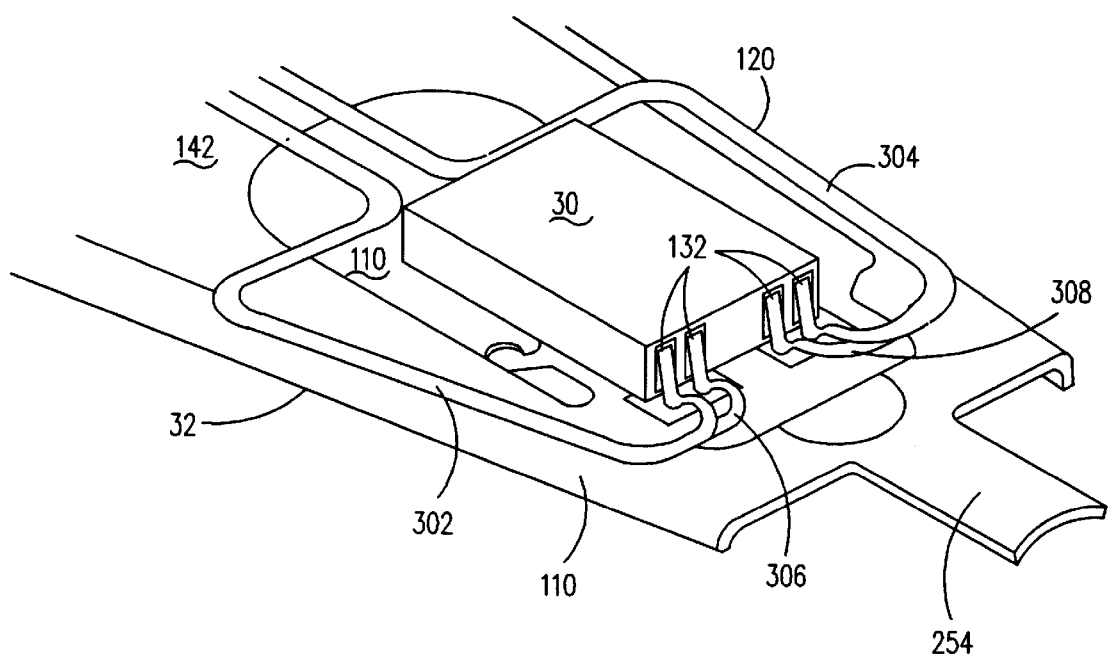
FIG. 7 is a detailed perspective view of the system of FIG. 1.

FIG. 7 shows a detailed view of the head 30 and suspension 32. Note how the stacked lines 120 separate at the head termination pads 132. The top lines 302 and 304 separate from their corresponding bottom lines 306 and 308. The top lines 302 and 304 attach to the outer pads 132 and the bottom lines 306 and 308 attach to the inner pads 132.

Figure 8:
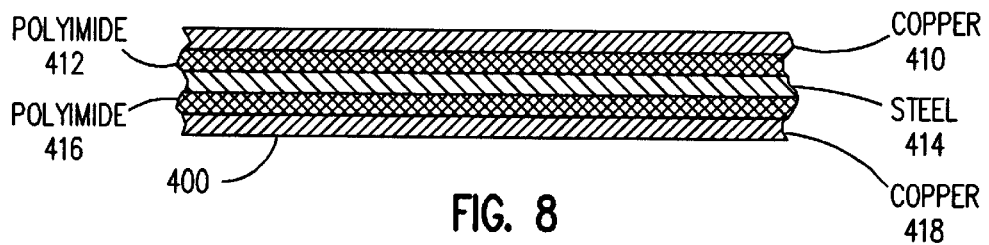
FIG. 8 is a cross sectional view of a laminated material.
Figure 9:
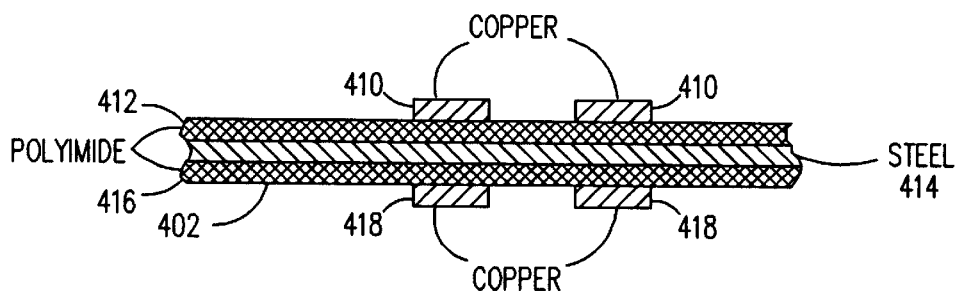
FIG. 9 is a cross sectional view of an alternative embodiment of a laminated member.

FIGS. 8 and 9 show cross sectional views of an alternative embodiment of the laminated material 400 and laminated member 402, respectively. Laminated material 400 has a copper layer 410, polyimide layer 412, steel layer 414, polyimide layer 416 and copper layer 418. Note that steel layer 414 is located between the two conducting layers. FIG. 9 shows a laminated member 402 formed from material 400. Note that the stacked electrical lines now run on either surface of the support layer. Placing the lines on both sides of the support layer further increase the number of lines which may be accommodated in a give suspension width. Laminated member 402 may be substituted for member 112 in suspension 32.

Figure 10:
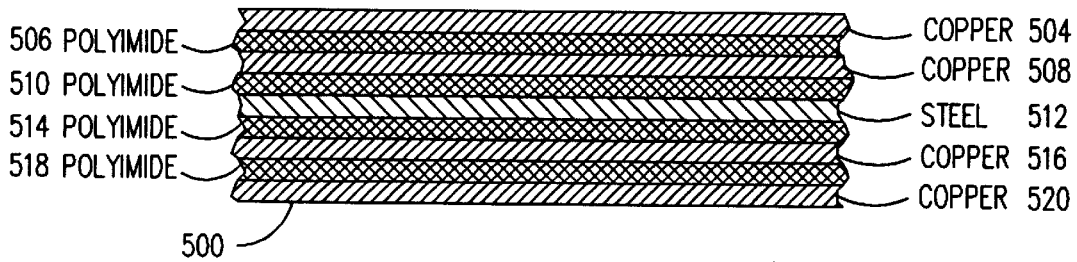
FIG. 10 is a cross sectional view of a laminated material.
Figure 11:
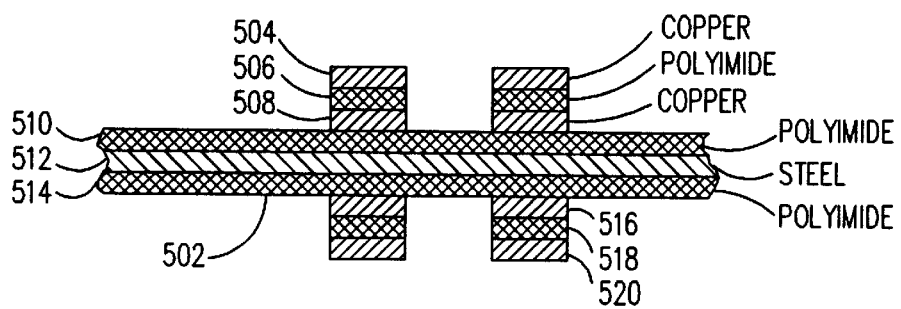
FIG. 11 is a cross sectional view of an alternative embodiment of a laminated member.

FIGS. 10 and 11 show cross sectional views of alternative embodiments of the laminated material 500 and laminated member 502, respectively. Member 502 is similar to member 402 except that extra copper and insulating layers have been added to both sides. This allows for stacking additional electrical lines on either side. Laminated material 500 has copper layers (504, 508, 516, 520) and polyimide layers (506, 510, 514, 518) and steel layer 512.

Figure 12:
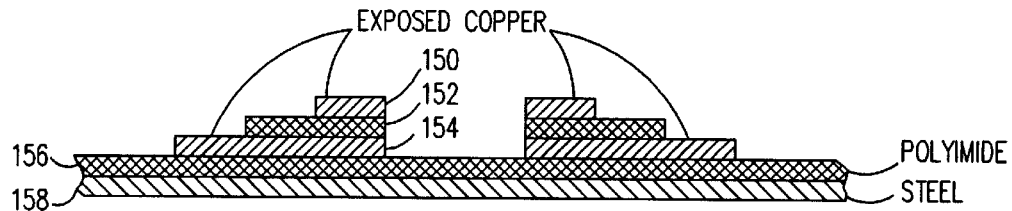
FIGS. 12–16 show cross sectional views of various alternative embodiments of a laminated member.
Figure 13:
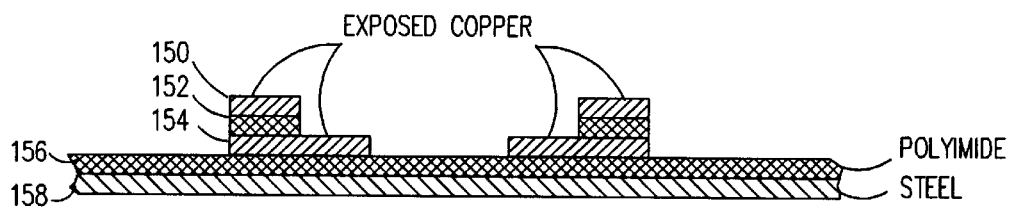
Figure 14:
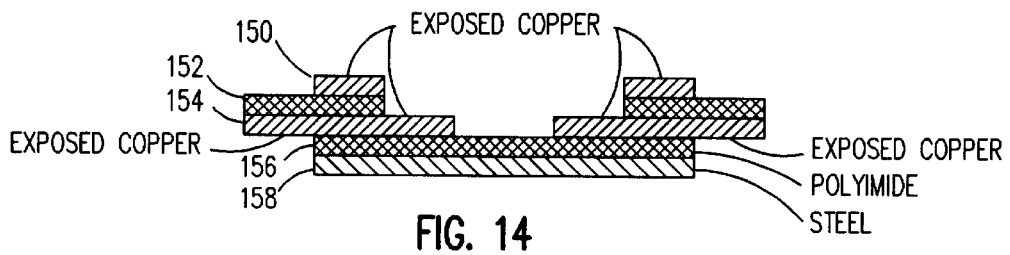
Figure 15:
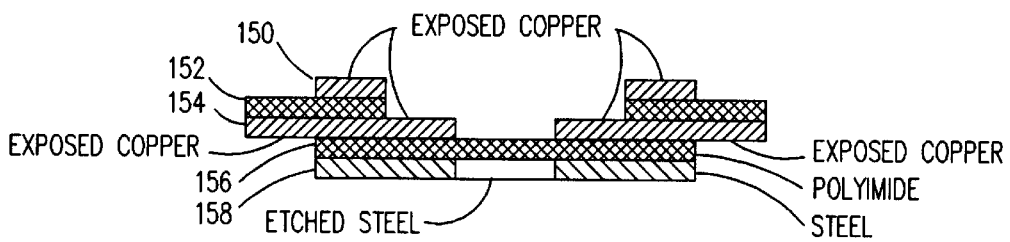
Figure 16:
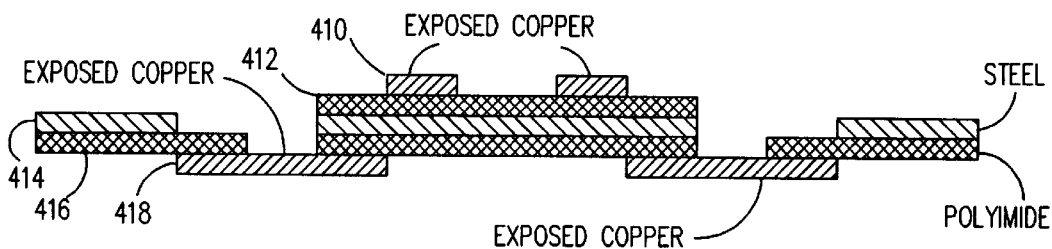

FIGS. 12–16 show cross sectional views of additional alternative embodiments of the laminated member. FIGS. 12–13 show how the extension of the bottom copper layer can create exposed copper areas for purposes of electrical connection. FIGS. 14 and 15 also show exposed copper areas for electrical connection. In both cases the electrical connection may be made from below the suspension. In FIG. 16 a member is shown similar to member 402 with a supporting steel layer in the middle. Electrical connection to the bottom leads may be made through apertures etched into the support layer. FIGS. 15 and 16 show one set of electrical leads on either side of the steel support layer. However, additional stacked electrical leads could be added on top of or below the existing leads, with additional insulating layers located in between.

All of the alternative embodiments of laminated members shown in FIGS. 11–16 may be substituted for member 112 in the suspension 32.

While the preferred embodiments of the present invention have been illustrated in detail, it should be apparent that modifications and adaptations to those embodiments may occur to one skilled in the art without departing from the scope of the present invention as set forth in the following claims.

We claim:

1. A transducer suspension system comprising:

a support layer having a longitudinal axis, a lateral axis, and a perpendicular axis;

a electrically insulating layer overlying a first planar surface of the support layer;

a first electrically conducting layer overlying the first electrically insulating layer, the first electrically conducting layer having etched electrical leads;

a second electrically insulating layer overlying the planar surface of the support layer; and a second electrically conducting layer overlying the second electrically insulating layer, a second electrically conducting layer having etched electrical leads, each electrical lead of the second electrically conducting layer substantially overlying a corresponding electrical lead of the first electrically conducting layer, wherein the width of the electrical leads of the first electrically conducting layer are greater than the width of the electrical leads of the second electrically conducting layer and the second electrically insulating layer such that a portion of the top surface of the electrical leads of the first electrically conducting layer is exposed.

2. A transducer suspension system comprising:

a support layer having a longitudinal axis, a lateral axis, and a perpendicular axis;

a first electrically insulating layer overlying a planar surface of the support layer;

a first electrically conducting layer overlying the first electrically insulating layer, the first electrically conducting layer having etched electrical leads;

a second electrically insulating layer overlying the planar surface of the support layer;

a second electrically conducting layer overlying the second electrically insulating layer, the second electrically conducting layer having etched electrical leads, each electrical lead of the second electrically conducting layer substantially overlying a corresponding electrical lead of the first electrically conducting layer, wherein the width of the electrical leads of the first electrically conducting layer are greater than the width of the electrical leads of the second electrically conducting layer and the second electrically insulating layer such that a portion of a top surface of the electrical leads of the first electrically conducting layer is exposed;

a transducer element attached to the support layer;

a recording media located proximate to the transducer element;

a media movement device for moving the media;

a transducer movement device for moving the transducer relative to the media; and an electrical device connected to the electrical leads of the first and second electrically conducting layers of the suspension for reading data from the media.

* * * * *